United States Patent
Zheng et al.

(10) Patent No.: US 6,255,226 B1
(45) Date of Patent: Jul. 3, 2001

(54) OPTIMIZED METAL ETCH PROCESS TO ENABLE THE USE OF ALUMINUM PLUGS

(75) Inventors: Tammy Zheng, Fremont; Calvin Todd Gabriel, Cupertino; Samit Sengupta, San Jose, all of CA (US)

(73) Assignee: Philips Semiconductor, Inc., Tarrytown, NJ (US)

( * ) Notice: Subject to any disclaimer, the term of this patent is extended or adjusted under 35 U.S.C. 154(b) by 0 days.

(21) Appl. No.: 09/201,987

(22) Filed: Dec. 1, 1998

(51) Int. Cl.⁷ .................................................. H01L 21/302
(52) U.S. Cl. .................... 438/734; 438/697; 438/720; 438/723; 438/738; 438/742; 438/743
(58) Field of Search ...................... 438/636, 692, 438/697, 700, 720, 723, 734, 738, 743, 742

(56) References Cited

U.S. PATENT DOCUMENTS

| | | | |
|---|---|---|---|
| 5,103,287 | * | 4/1992 | Mase et al. ............................ 357/71 |
| 5,714,804 | * | 2/1998 | Miller et al. ......................... 257/763 |
| 5,913,141 | * | 6/1999 | Bothra .................................. 438/625 |

FOREIGN PATENT DOCUMENTS

| | | | |
|---|---|---|---|
| 1-149436 | * | 6/1989 | (JP) . |
| 6-216089 | * | 8/1994 | (JP) . |
| 7-066202 | * | 3/1995 | (JP) . |
| 8-031935 | * | 2/1996 | (JP) . |

OTHER PUBLICATIONS

US Patent application 09/035735, filed Mar. 5, 1998.

* cited by examiner

Primary Examiner—Gregory Mills
Assistant Examiner—George Goudreau
(74) Attorney, Agent, or Firm—Peter Zawilski

(57) ABSTRACT

In modern sub-micron technologies with aggressive design rules, it is not always possible to have complete overlap of conductive lines with underlying vias. A process for manufacturing a semiconductor device having metal interconnects reduces or eliminates the recessing of metal in the vias, particularly when the metal in the vias is aluminum or an aluminum alloy. By manipulating the etch chemistry so that the etch rates of the aluminum alloy, the surrounding barrier metals, and the dielectric are comparable, it is possible to perform the metal over etch without forming voids in the exposed portion of the via. By eliminating the voids, thinning of the vias due to the presence of recesses is minimized, and electrical connections are less susceptible to electromigration. Consequently, device yield and reliability are increased.

24 Claims, 7 Drawing Sheets

FIG.4-1

| | Step 01 | Step 02 |
|---|---|---|
| Main etch chamber | | |
| Pressure (mT) | 0.00 | 10.00 |
| RF-Top (W) | 0 | 0 |
| RF-Bottom (W) | 0 | 0 |
| Gap (cm) | N/A | N/A |
| BCl3 (sccm) | 40.0 | 40.0 |
| Cl2 (sccm) | 40.0 | 40.0 |
| SF6 (sccm) | 0.0 | 0.0 |
| He clamp (T) | 0.0 | 10.0 |
| Completion | Stabl | Stabl |
| Time | 30s | 30s |
| Channel | | |
| Delay (sec) | | |
| Norm (sec) | | |
| Norm value | | |
| Trigger (%) | | |
| | | |
| Electrode Temp | 50.0°C | |
| Chamber Temp | 60.0°C | |

| TIN + AlCUu Bulk | AlCu Endpoint | Copper Residue |
|---|---|---|
| Step 03 | Step 04 | Step 05 |
| 10.00 | 10.00 | 10.00 |
| 360 | 360 | 360 |
| 100 | 225 | 225 |
| N/A | N/A | N/A |
| 40.0 | 40.0 | 50.0 |
| 40.0 | 40.0 | 30.0 |
| 0.0 | 0.0 | 0.0 |
| 10.0 | 10.0 | 10.0 |
| Time | EndPt | Time |
| 24s | 50s | 5s |
|  | 262nm |  |
|  | 14 |  |
|  | 2 |  |
|  | 0 |  |
|  | 90 |  |

FROM FIG. 4-1

| | | |
|---|---|---|
| Ti + | | |
| 1:1:1 Overetch | | |
| Step 06 | Step 07 | Step 08 |
| 10.00 | 0.00 | 0.00 |
| 360 | 0 | 0 |
| 100 | 0 | 0 |
| N/A | N/A | N/A |
| 50.0 | 0.0 | 0.0 |
| 30.0 | 0.0 | 0.0 |
| 20.0 | 0.0 | 0.0 |
| 10.0 | 0.0 | 0.0 |
| Time | Time | End |
| 50s | 10s | s |
| | | |
| | | |
| | | |
| | | |
| | | |

FROM FIG. 4-2

OPTIMIZED METAL ETCH PROCESS TO ENABLE THE USE OF ALUMINUM PLUGS

FIELD OF INVENTION

The present invention is generally directed to the manufacture of a semiconductor device. In particular, the present invention relates to prevention of the formation of voids in metal plugs that connect metal interconnect lines at different levels.

BACKGROUND OF INVENTION

Over the last few decades, the electronics industry has developed semiconductor technology to fabricate small, highly integrated electronic devices. Many semiconductor devices are now formed by vertical stacking of device layers, including multiple layers of conductive lines with interconnects between layers. As these devices become smaller, there is a need for increasingly narrow conductive lines and interconnects to form circuit pathways within these devices. These conductive lines and interconnects are typically formed using metals, including, for example, aluminum, tungsten, and copper.

In a multilevel architecture, layers of metal conductive lines which define circuit pathways are separated from each other by interlevel dielectrics. In a typical process, a first metal layer is deposited and patterned to form a first set of conductive lines. Deposition of a dielectric layer over the first set of conductive lines follows. Vias are etched through the dielectric layer to the underlying conductive lines and then filled with metal to establish interlayer conduction. In conventional processing methods, the metal typically extends beyond the vias when deposited. This excess metal is removed by, for example, chemical-mechanical polishing or etch back. A second metal layer may then be formed over the dielectric layer and patterned into a second set of conductive lines.

With current aggressive design rules, it is not always possible to have complete overlap of conductive lines with underlying metal-filled vias. This typically leaves at least a portion of the metal-filled vias exposed during the etch process in which the second set of conductive lines is patterned. A recess in the exposed portion of the metal-filled vias may be formed during this process. For example, if an aluminum conductive line is formed over the metal-filled via and the aluminum conductive line does not completely overlap the underlying metal-filled via, it is possible that a portion of metal-filled the via may be etched during the formation of the conductive lines. This recessing can lead to electromigration failure. Furthermore, recesses in the vias may trap chemicals or gases during subsequent processing steps. These chemicals and gases may lead to device degradation over time. In addition, the effective thinning of the via due to the presence of the recess increases the current density through that portion of the via which may lead to local overheating and electromigration. The conductive line formation typically includes one or more metal etching steps.

In an example process using a 248 nm deep ultraviolet stepper, the expected misalignment of the metal mask to the via mask is less than 0.08 $\mu$m. A design rule allowing no metal-to-via overlap will result in at most 0.08 $\mu$m of the aluminum alloy plug being exposed. During metal over etch, for a 0.3 $\mu$m diameter via, the maximum Al plug cross-sectional area removed may be 21%. Thus, in the above example, up to one fourth of the via may be susceptible to recessing.

Tungsten is used to fill the vias in order to reduce the recess formed during subsequent processing steps. Tungsten-filled vias provide adequate selectivity during metal etching steps. However, the presence of tungsten in the path of current flow may lead to flux divergence in the metal lines at the tungsten/metal interfaces, thereby degrading the electromigration resistance.

To address this issue, aluminum, and aluminum alloys have been suggested for incorporation in the vias. In addition to reducing via resistance, aluminum vias may also show better electromigration resistance. The use of aluminum in vias is expected to become more important as the device dimensions become smaller. Conventional techniques include filling the vias with tungsten or aluminum, polishing or etching back the tungsten or aluminum to remove excess deposits outside of the via, and then depositing a second metal layer for making the conductive lines.

When aluminum is incorporated in the vias, a conventional metal etch technique cannot be used to form the conductive line, that are also typically aluminum, because the aluminum in the vias may be exposed to metal etchants which may create recessing in the vias.

One technique for reducing or eliminating the recessing of metal in the vias, particularly when the vias are formed using aluminum or an alloy thereof, involves first forming a via in a device layer of a semiconductor device, and then forming a barrier layer over the device layer. This barrier layer generally conforms to the underlying surface topology of the device layer. Following that, a metal layer is formed over the barrier layer; it also fills the via to form a via structure. A portion of the metal layer is removed. The remaining portion of the metal layer forms a conductive structure having a sidewall extending from a surface of the barrier layer. Next, a spacer is formed along the sidewall of the conductive structure. A portion of the barrier layer is removed using the spacer to protect a portion of the metal via structure adjacent the surface of the device layer. Consequently, the recessing is reduced or eliminated.

While the above technique adequately reduces or eliminates the recessing of metals for some applications, there is an ongoing need to further reduce processing and costs, and adverse impacts upon device yield. The present invention addresses the above-mentioned need and provides an improved method to prevent the formation of recesses in metal-filled vias.

SUMMARY OF INVENTION

The present invention is exemplified in a number of implementations, a number of which are summarized below. According to one embodiment, a method for making a semiconductor device having aluminum alloy lines over aluminum alloy plugs comprises the steps of forming a first metal layer, forming a dielectric layer over the first metal layer. Following that, a via is defined in the dielectric layer that has sufficient depth to expose the first metal layer. Next, the method forms an aluminum alloy plug in the via. Upon the via, a second metal layer is formed. With a first etch chemistry, the second metal layer is etched. After the second metal layer is etched, a second etch chemistry is used such that the etch rate of the second metal and any exposed dielectric are comparable. Lastly, the second metal layer is over etched.

According to another embodiment, the method for making a semiconductor device having aluminum alloy lines over aluminum alloy plugs without forming plug recesses further includes a process to assure that any portion of the aluminum alloy plug not covered by the second metal layer is etched substantially flush with the surrounding dielectric.

In another embodiment, the first metal layer and second metal layer are built with aluminum alloys coupled with barrier layers.

In yet another embodiment, the etching of the second metal uses a chlorine-based chemistry and the changing of the etch chemistry involves the use of fluorine-based chemistry.

The above summary of the present invention is not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which:

FIG. 4 depicts a process recipe according to one example embodiment of the present invention.

Figure 1A:
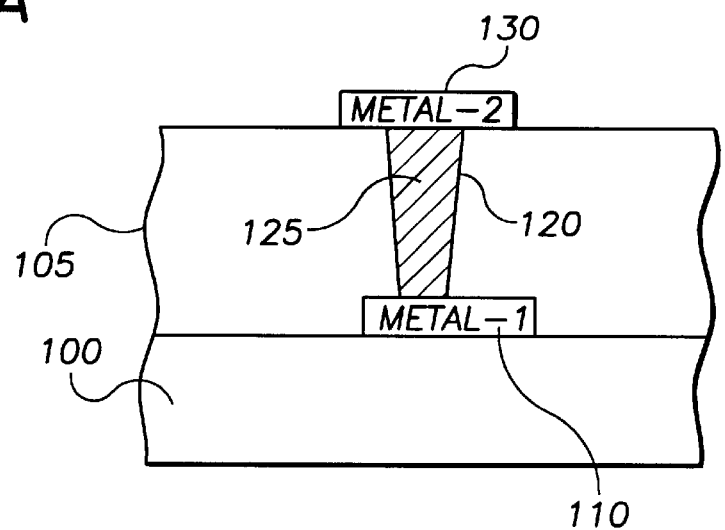
FIG. 1A is a cross-sectional view of an example semiconductor structure in which a second metal layer fully covers a tungsten plug interconnect to a first metal.

While the invention is susceptible to various modifications and alternative forms, specific embodiments thereof, have been shown by way of example in the drawings and will herein be described in detail. It should be understood, however, that it is not intended to limit the invention to the particular forms disclosed; but on the contrary, the intention is to cover all modifications, equivalents, and alternatives falling within the spirit and scope of the invention as defined by the appended claims.

DETAILED DESCRIPTION

Many deep sub-micron processes use Tungsten (W) to form a conductive plug between aluminum-based metal (Al) interconnect levels. In an example conventional process, a goal is to have accurate alignment between conductive lines in the first metal layer, the plug, and the conductive lines in the second metal layer and all layers thereafter. However, process variations often result in misalignment between the layers. Consequently, the second metal layer may only partially cover the W plug. As mentioned earlier, tungsten-filled plugs provide adequate selectivity during the Al metal etching steps, but there is a tradeoff between possible degradation between the tungsten/metal interface and the etch selectivity.

Referring to FIG. 1A, in a device layer 105 on top of a substrate 100, there is a first metal layer 110, a second metal layer 130 and a via 120. The second metal layer 130 completely covers the via 120 which is filled with tungsten (W) to form a W plug 125. Many deep sub-micron processes use tungsten to form conductive plugs between two aluminum-based(Al) metal inter-connect levels.

Figure 1B:
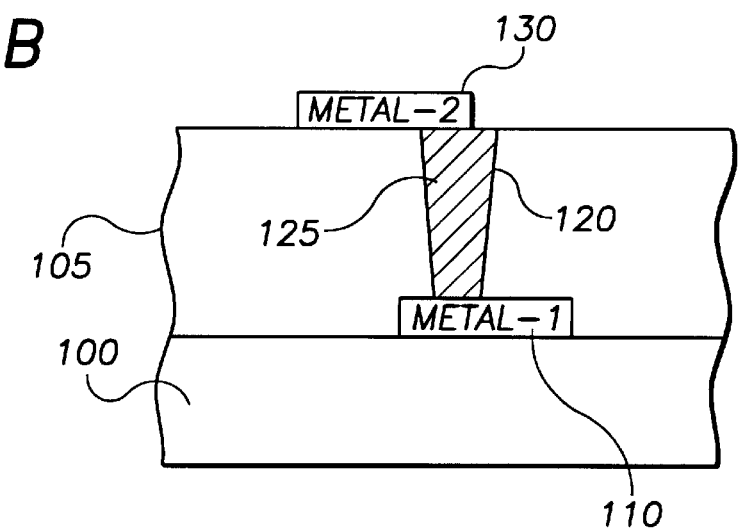
FIG. 1B is a cross-sectional view of a semiconductor structure in which the second metal layer does not fully cover the tungsten plug interconnect.

If the second metal layer 130 does not completely cover the W plug 125, the structure depicted in FIG. 1B results. Where aggressive design rules are used in many modem processes, backend structures may necessitate the use of via and metal structures that do not always allow for complete overlap of metal lines over underlying plug.

Aluminum plugs possess several advantages over tungsten plugs. In particular, Al plugs offer superior electromigration (EM) resistance, lower via resistance, and a simpler process. However, Al is more susceptible to over-etch that W, and the over etching of an aluminum-based plug may result in a void in the plug.

Figure 1C:
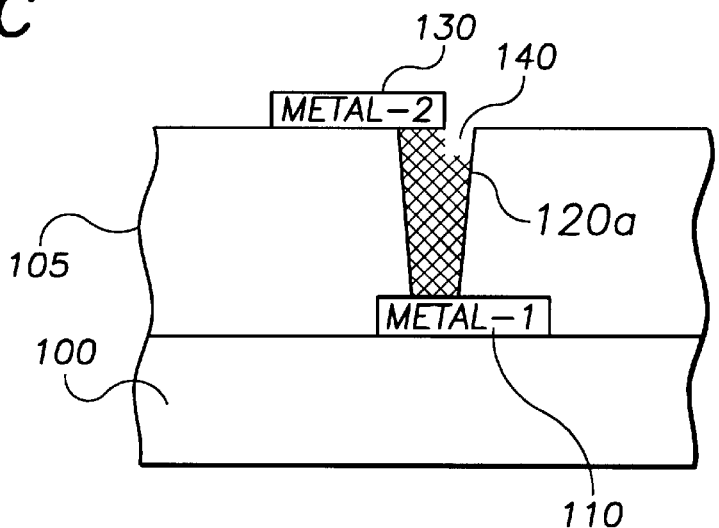
FIG. 1C is a cross-sectional view of an example semiconductor structure in which a recess has been formed in an exposed Al plug.

Referring to FIG. 1C, the second metal layer 130 does not cover the Al. Etch of the Al-alloy second metal may create a recess 140 in the Al plug 120a.

The above figures present only a simplified view of the result that may be expected in using an aluminum-based plug process. Also the process is not limited to just a two layer metal system, it can readily be applied to the interconnects between a third, fourth or nth layer metal or stacked via/metal chains, as well.

According to an example embodiment of the present invention, a process is provided for reducing the incidence of recesses in aluminum-based plugs. After forming the conductive lines of the first metal level, a dielectric layer is deposited over the first metal level. Next, a via of sufficient depth to expose a portion of a selected conductive line, is opened in the dielectric layer. Instead of tungsten, the process uses aluminum alloy to fill the via and a conductive line is formed near the Al plug. A second metal layer is formed over the dielectric layer. With a first selected chemistry, the second metal layer is etched and a conductive line is formed near the Al plug. As explained above, the conductive line of the second metal level may not completely cover the Al plug. After the first phase of etching, the chemistry is adjusted so that the etch rate for the second metal layer and the exposed dielectric layer are similar. The etching resumes as an "over-etch" to clear out aluminum alloy residue that my be present on the dielectric layer. Any portion of the aluminum plug not covered by the second metal layer is etched and the adjusted chemistry results in the plug being etched substantially flush with the surrounding dielectric.

Figure 2A:
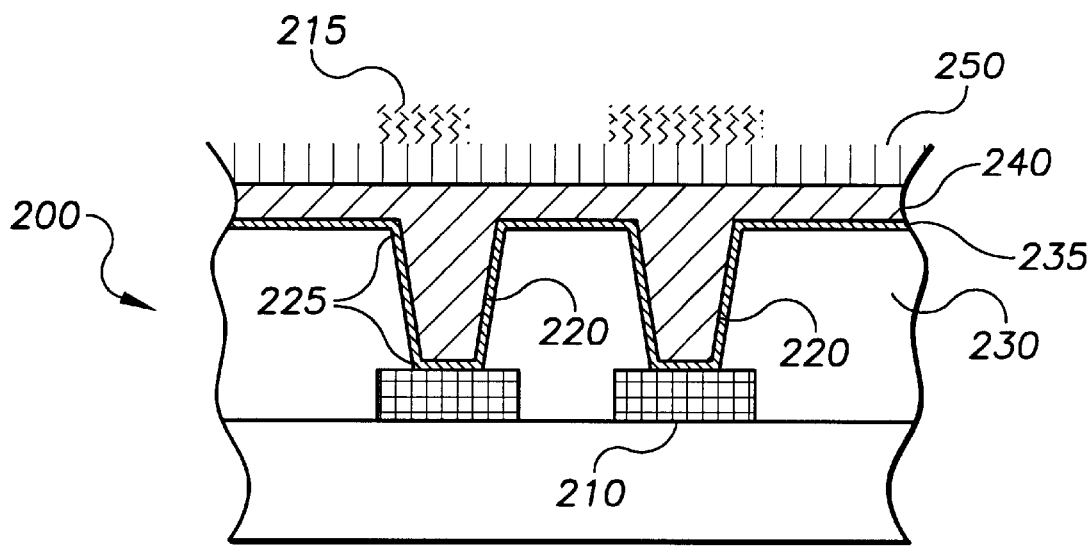
FIG. 2A shows in cross-section an example process according to the present invention in which the Al alloy is deposited to fill the via and form a second metal layer in a single process step, an anti-reflection coating is applied thereon in preparation for the second metal layer masking.

Referring to FIG. 2A, an example process for building Al metal interconnect begins by forming an example via 220 above a conductive line 210 in a device layer 230 of a semiconductor device 200.

The device layer 230 includes a dielectric material. Examples of dielectric materials include silicon dioxide, silicon oxynitride, silicon oxyfluoride, silicon nitride, other oxides and nitrides, amorphous carbon, spin-on glasses (e.g., silicates, siloxanes, hydrogen silsesquioxane, and alkyl silsesquioxanes), polymers (e.g., polyimides and fluoropolymers), and other non-conductive materials.

It will be appreciated that the via 220 may be utilized in other types of layers in an integrated circuit. The via 220 may be formed by a variety of techniques. Examples of suitable techniques include etching processes, such as, wet etching, dry etching, and plasma etching. Plasma etching techniques are particularly useful because the etch rate is higher in the vertical direction than the horizontal direction (an anisotropic etch). These techniques are well known for forming via 220 or other trench-like structures in a semiconductor device 200.

One example process includes applying a photoresist over the device layer 230 and patterning the photoresist according to the desired via pattern. Material from the device layer 230 is removed by, for example, an anisotropic plasma etch, to form the via 220. The particular etchant used typically depends on the material of the device layer 230 and the etching process.

In the example structure 200, a conductive line 210 is formed prior to the device layer 230. The via 220 connects conductive line 210 to conductive lines in another metal layer. Thus, the via 220 typically extends through the device layer 230 to the underlying conductive line 210. An example via 220 has a diameter of, approximately 0.2 $\mu$m to 2.5 $\mu$m; however, vias of other sizes may also be used. Example vias also have a cylindrical or rectangular cross-section, however, other cross-sections, such as a square, or ovoid, may be suitable. The height of the vias varies depending on the thickness of the device layer 230 and the height of the underlying conductive lines. In an example embodiment, this height may be approximately 0.3 $\mu$m to 5.0 $\mu$m. Other heights may also be used.

After formation of the vias 220, a barrier layer 235 is formed over the surface of the device layer 230, as well as over the sidewalls and on the bottom surface of the vias 220. The barrier layer 235 is generally used to protect the device layer from interaction with a subsequently deposited metal layer 240. Such interaction may include, for example, chemical reactions between the device layer 230 and the metal layer 240, as well as diffusion of metal atoms from the metal layer 240 into the device layer 230. In addition, the barrier layer 235 provides an easily wetted surface for the metal layer 240 that may improve the filling of the vias 220 with the metal layer 240. Also, the barrier layer 235 may improve the adhesion between the device layer 230 and the metal layer 240, as well as the grain structure of the metal layer 240. A variety of materials may be used to form the barrier layer 235. For example, titanium, titanium nitride (TiN), tantalum, tantalum nitride, tungsten nitride, molybdenum, molybdenum nitride, or various combinations thereof are commonly used materials for use in forming the barrier layer 235. Other materials that are compatible with the device layer 230 and metal layer 240 may also be used. The barrier layer 235 is often formed using a material which is conductive; although typically the material of the barrier layer 235 is not as conductive as the material of the metal layer 240. A conductive barrier layer 235 can carry current for damaged metal in the via 220.

The thickness of the barrier layer 235 may vary over a wide range. Typical values for the thickness of the barrier layer 235 range from approximately 50 Å to 1000 Å.

In other embodiments, one or more additional layers may be formed between the barrier layer 235 and the device layer 230. Such layers may include, for example, passivation layers or layers which provide structural support for the subsequently deposited layers.

Referring back to FIG. 2A, a metal layer 240 is formed over the barrier layer 235. The metal layer 240 also fills via 220 to form via structure 225. The metal layer 240 formed over the barrier layer 235 and within via 220 may be formed in a single step. Alternatively, the via 220 may first be filled with a metal material and then, using the same or different formation conditions (e.g., deposition rate or temperature), the metal layer 240 may be formed over the barrier layer 235.

The metal layer 240 may be formed using a variety of materials. Examples of suitable materials for the metal layer 240 include metals and alloys, such as, for example, aluminum, copper, tungsten, or aluminum/copper alloys. Other conductive metals and alloys may also be used.

The metal layer 240 may be formed using a variety of techniques. Examples of suitable techniques include cold or hot physical vapor deposition (PVD), sequential chemical vapor deposition (SCVD), CVD/PVD, low pressure PVD, and PVD followed by high pressure and/or high temperature re-flow to fill the vias 220. The metal layer 240 has a thickness of, for example, 2000 Å to 10,000 Å (above the device layer 230). One advantage to this process is that the metal that fills the via 220 and the metal which forms the conductive lines above the via may be sequentially deposited without an intervening polishing or etch-back step. This may reduce the number of process steps needed to form the desired structure. Conventional methods typically separate steps, including the intervening polish or etch back step, for filling the via and forming the metal layer.

An anti-reflective coating (ARC) layer 250 is formed over the metal layer 240 to reduce the reflection of light during a subsequent photo-lithographic patterning process. Metals, such as aluminum, tungsten, and copper, typically have a relatively high reflectivity. Therefore, it is often necessary to provide an ARC layer with reduced reflectivity to reduce the broadening or narrowing of features. For example, in the absence of the ARC layer 250, "reflective notching" occurs when the topography of the underlying surface (e.g., a slope in the topography) causes the reflection of light at angles that are not perpendicular to the surface of the photo-resist. The ARC layer 250 may also protect the metal layer 240 during subsequent processing steps, as well as provide a barrier between the metal layer 240 and subsequently deposited layers, such as a dielectric layer. In addition, the ARC layer may enhance adhesion of subsequently deposited dielectric layers. Materials suitable for the ARC layer 250, typically have low reflectivity of light for the wavelength range used to form the pattern. Therefore, the particular materials useful for forming the ARC layer 250 depend on the size of the features and the design rules. For 0.25 $\mu$m design rules, titanium nitride is a useful material for the ARC layer 250. Other suitable or additional materials for the ARC layer 250 include, for example, silicon oxynitride, silicon nitride, silicon dioxide, and organic ARC materials. Although the ARC material may be nonconductive, it may be often desirable to use a conductive ARC. Otherwise, the ARC material needs to be removed, at least in via locations, to allow connection between the structure 255 formed from the metal layer 240 and subsequently formed interconnects or contacts.

The thickness of the example ARC layer 250 is about 200 Å to 3000 Å. Often, the ARC layer 250 has an increased thickness (an additional 50 Å to 1000 Å) relative to a similar ARC layer used in conventional techniques because later processing steps typically remove portions of the ARC layer 250, as described below.

In some embodiments, an ARC layer 250 is not formed, particularly if the size of the device features is not critical or if the reflectivity of the metal layer 240 is otherwise controlled. In these embodiments, the thickness of the metal layer 240 may be increased by 50 Å to 1000 Å because subsequent processing steps may remove additional portions of the metal layer 240.

After the formation of the ARC layer 250, a photoresist layer (not shown) is formed over the ARC layer 250 (or metal layer 240, if an ARC layer is not used). The photoresist layer is patterned leaving portions 215, as shown in FIG. 2A.

Figure 2B:
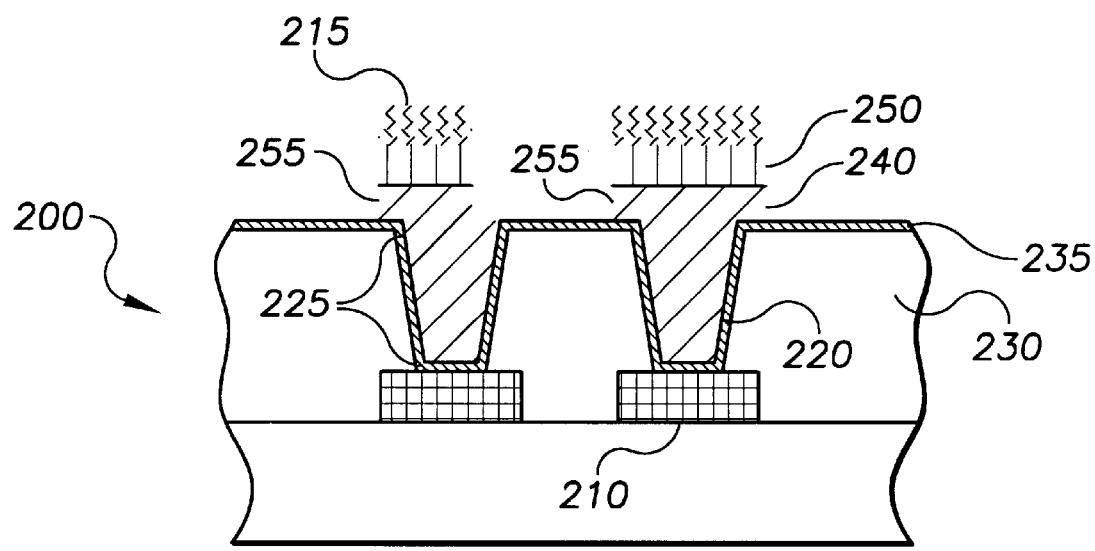
FIG. 2B shows in a cross-section the unmasked areas of FIG. 2A etched away.

Referring now to FIG. 2B, a portion of the metal layer 240 and ARC layer 250 are removed according to the pattern formed by portions of 215 of the photoresist layer. The removal of the portion of the metal layer 240 and the ARC layer 250 may be accomplished by a variety of techniques, including, for example, wet etching, dry etching, and plasma etching. It may be desirable to use an anisotropic etching technique, such as dry plasma etching, to leave relatively straight sidewalls. Typically, the removal of the portions of the metal layer 240 and ARC layer 250 continues until the barrier layer 235 is exposed. In some embodiments, the removal process continues until all or nearly all the barrier layer 235 between the remaining portions 255 of the metal layer 240 and ARC layer 250 is exposed. In these embodiments, the barrier layer 235 may be treated as an etch stop so that an end of the removal process is indicated when a threshold amount of the material of the barrier layer 235 is detected.

Figure 2C:
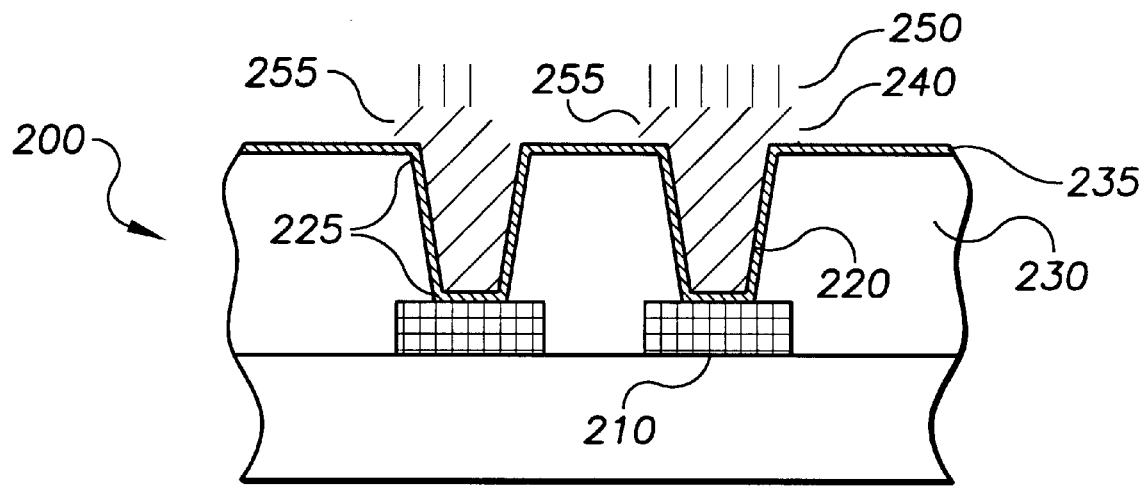
FIG. 2C shows in a cross-section the structure of FIG. 2B after mask strip.

The photoresist portion 215 (FIG. 2B) is subsequently removed, as shown in FIG. 2C. Removal of the photoresist layer may be accomplished by a variety of techniques including, for example, selective etching or ashing (particularly if the photoresist layer is made using an organic photoresist). The remaining portions 255 of the metal layer 240 and the ARC layer 250 form conductive structures 255 that may be used as conductive lines or vias. If an anisotropic etching technique is used to remove the portion of the metal layer 108 and the ARC layer 250, then the sidewalls of the conductive structures 255 may be covered by a protective layer formed during the etching process. This protective layer may include polymers formed by the etchant material. The protective layer can often be removed during an ashing process or by a solvent strip process.

As illustrated in FIG. 2C, the conductive structures 255 may or may not be completely aligned with the underlying via structures 225. It is the portion of the via structure 225 that is not completely covered by the conductive structure 255 that is particularly susceptible to recess formation during subsequent processing in conventional fabrication processes.

Figure 2D:
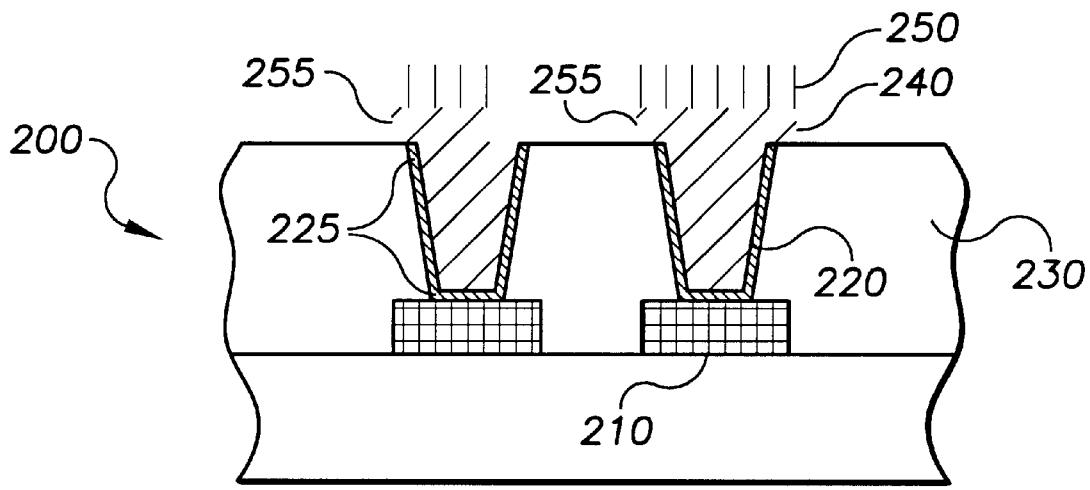
FIG. 2D illustrates in a cross-section the structure after an Al plug etch process according to the present invention.
Figure 3:
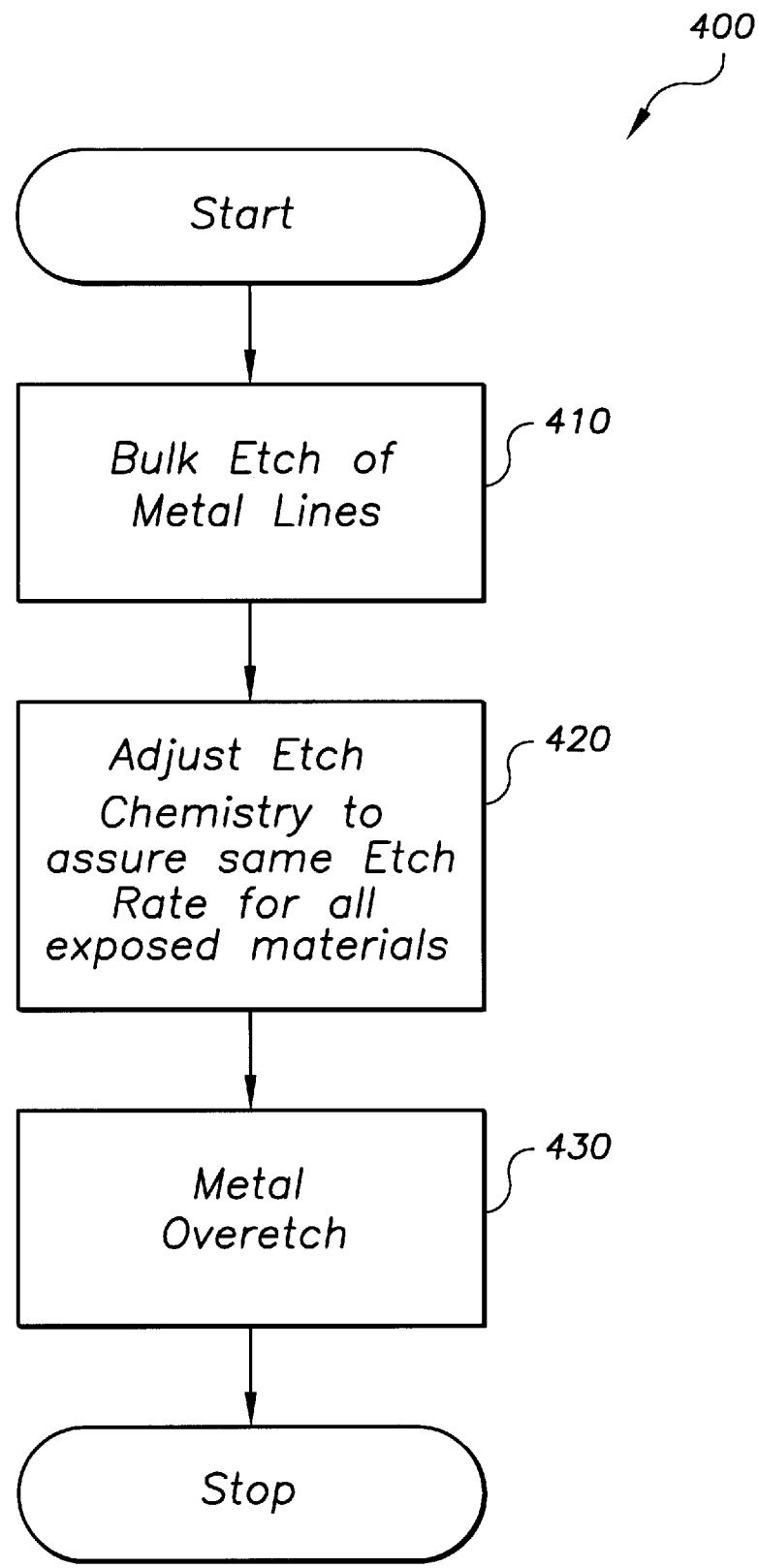
FIG. 3 outlines an aluminum plug process according the present invention.

Referring to FIG. 2D, according to one embodiment of the present invention, to prevent recess formation in the non-overlapping portions of the via structures during the over etch process of the aluminum alloy metal lines, an example process 400 as outlined in FIG. 3 may be followed.

After the bulk etch 410 of the aluminum lines is completed and the photoresist is stripped off, a structure such as shown in FIG. 2c results. However, to "clean" up the metal lines, an over-etching is required. The user adjusts the etch chemistry 420 to etch all the exposed materials at the same rate during the metal over-etch 430. For example, etching the aluminum, titanium, and oxide films at 1:1:1 selectivity assures that the surrounding oxide etches at the same rate as that of the aluminum or other metal residues. Thus, as depicted in FIG. 2D, no recess or void will form in the plug 220.

A chlorine-based chemistry (e.g., $Cl_2$, $BCl_3$, HCl, etc), can be used with the present invention to etch aluminum and titanium. With this chemistry, dielectric oxide usually has a lower etch rate, so that the selectivity ratio of Al:oxide or Ti:oxide is about 5:1. In order to increase the oxide etch rate to obtain a 1:1:1 selectivity ratio among Al, Ti, and oxide, a fluorine-containing gas such as $SF_6$ or $CF_4$ can be added. Also, other process adjustments can be made, such as the pressure, RF power, gas flow rates, etc.

While fluorine-based plasmas etch oxide, they do not significantly etch Al and Ti under normal conditions. According to an example process, the amount of $SF_6$ or $CF_4$ can be adjusted to realize the 1:1:1 selectivity. At the end of the over etch process, with this selectivity, the aluminum alloy lines will be formed with no plug recess as shown in FIG. 2D.

In another embodiment according to the present invention, the depth of etch into the exposed plug can be further minimized by reducing the required over etch. For example, a reduced-Aspect Ratio Dependent Etch (ARDE) chemistry by the addition of $Ar/CHF_3$ to the bulk Al etch step, reduces the extra over etch time needed to remove metal in narrow spaces. Another example reduced ARDE chemistry that may be used is $N_2/Cl_2$. By using a reduced ARDE process, the etch rate does not depend so much on the space width between the metal lines.

In yet another embodiment according to the present invention, another approach is modify the Al etch step to achieve higher selectivity (up to 5:1) to the barrier metal, for example, Ti. While Ti protects the oxide, most of the Al over-etch may be accomplished. Extending the concept further, adding films such as TiW to the barrier layer makes is possible to achieve an Al:TiW selectivity in the range of 10–15:1. With such a process, the plasma is not acting upon the oxide for as long a period. Consequently, the oxide loss for a 5000 Å for an Al film is reduced to approximately 500 Å to 1000 Å.

FIG. 4 is an example process according the present invention. Step 01 begins with loading wafers into an etching chamber; the chamber is pumped down vacuum conditions. The electrode temperature is maintained at 50° C. and the chamber temperature is maintained at about 60° C. throughout the process. Approximately 30 seconds are required to achieve a stable vacuum. Going to Step 02, the species of etchant gases, $BCl_3$ and $Cl_2$ are introduced into the chamber at a flow rate of 40 standard cubic centimeters per minute (sccm), and the chamber pressure is held to 10 mT. Approximately 30 seconds is needed to stabilize the flow.

The etching process begins at Step 03 for a "TiN & AlCu Bulk" etch. For about 24 seconds at a "Top-RF" power of 360 watts (W) and "Bottom-RF" power of 100 watts, the wafers are plasma etched with the $BCl_3$ and $Cl_2$ combination. Moving on to Step 04, the "AlCu Endpoint" etch is done for about 50 seconds with a trigger point of 90%, the "Bottom-RF" power is increased to 225 W. Copper residue left after the AlCu Endpoint etch is removed in the "Copper Residue" etch of Step 05, however the etchant species are adjust to 50 sccm for the $BCl_3$ and 30 sccm for $Cl_2$ for 5 seconds.

The "Ti & 1:1:1 Over-etch" is done at Step 06. $SF_6$ is introduced at a flow rate of 20 sccm, $BCl_3$ and $Cl_2$ continue to flow at 50 sccm and 30 sccm, respectively. About 50 seconds are required to perform the over etch step. The process completes at Step 07 and Step 08 when the etchant gases and RE power are switched off, and the system pumps down to vacuum. Finally, wafers are removed from the plasma etching apparatus further processing.

While the present invention has been described with reference to several particular example embodiments, those skilled in the art will recognize that many changes may be made thereto without departing from the spirit and scope of the present invention, which is set forth in the following claims.

What is claimed:

1. A method of making a semiconductor device having aluminum alloy lines over aluminum alloy plugs without forming plug recesses comprising:
    forming a first metal layer on a substrate;
    forming a dielectric layer over the first metal layer;
    defining a via in the dielectric layer of sufficient depth to expose the first metal layer;
    forming an aluminum alloy plug in the via;
    forming a second metal layer over the aluminum alloy plug;
    etching the second metal layer with a first etch chemistry;
    changing to a second etch chemistry, wherein the etch rates of the second metal layer and the exposed dielectric layer, as provided by the second etch chemistry are approximately equal; and
    over etching the second metal layer using the second etch chemistry.

2. The method as recited in claim 1 wherein over etching the second metal layer comprises etching a portion of the aluminum plug, not covered by the second metal layer, substantially flush with the surrounding dielectric.

3. The method as recited in claim 1 wherein the first etch chemistry comprises a chlorine-based chemistry and the second etch chemistry comprises a fluorine-based chemistry.

4. The method as recited in claim 1 wherein the first etch chemistry is selected from the group of HCl, $Cl_2$ and $BCl_3$ and the second etch chemistry is selected from the group consisting of $SF_6$, $CF_4$, $CHF_3$, and $C_2F_6$.

5. The method as recited in claim 1 wherein the second etch chemistry has a selectivity ratio of 1:1 for the aluminum alloy and the dielectric.

6. The method of claim 1 wherein the first etch chemistry comprises a chemistry selected from the group of HCl, $Cl_2$ and $BCl_3$ combined with at least one gas from the group consisting of $N_2$, Ar and $CHF_3$.

7. A method of making a semiconductor device having aluminum alloy lines over aluminum alloy plugs without forming plug recesses comprising:
    forming a first metal layer on a substrate;
    forming a dielectric layer over the first metal layer;
    defining a via in the dielectric layer of sufficient depth to expose the first metal layer;
    depositing a barrier layer substantially conforming to the via;
    forming an aluminum alloy plug in the via and;
    forming a second metal layer over the aluminum alloy plug;
    etching the second metal layer with a first etch chemistry;
    changing to a second etch chemistry, wherein the etch rates of the second metal layer, the exposed dielectric layer, and the barrier layer, as provided by the second etch chemistry are approximately equal; and
    over etching the second metal layer using the second etch chemistry.

8. The method as recited in claim 1 wherein over etching the second metal layer comprises etching portions of the aluminum plug and barrier layer, not covered by the second metal layer, substantially flush with the surrounding dielectric.

9. The method as recited in claim 7 wherein the second etch chemistry has a selectivity ratio of 1:1:1 for the aluminum alloy, barrier metal, and the dielectric.

10. The method as recited in claim 7 wherein the first metal layer and the second metal layer comprise aluminum alloys electrically coupled with the barrier layer.

11. The method of claim 7 wherein the first etch chemistry comprises a chemistry selected from the group consisting of HCl, $Cl_2$ and $BCl_3$.

12. The method of claim 7 wherein the first etch chemistry comprises a chemistry selected from the group of HCl, $Cl_2$ and $BCl_3$ combined with at least one gas from the group consisting of $N_2$, Ar and $CHF_3$.

13. The method of claim 7 wherein the barrier layer is comprised of a metal selected from the group consisting of titanium, tantalum, tungsten, and molybdenum.

14. A method of making a semiconductor device having aluminum alloy lines over aluminum alloy plugs without forming plug recesses comprising:
    forming a first metal layer;
    forming a dielectric layer over the first metal layer;
    defining a via in the dielectric layer of sufficient depth to expose the first metal layer;
    forming an aluminum alloy plug in the via;
    forming a second metal layer;
    etching the second metal layer with a first etch chemistry selected from the group consisting of HCl, $Cl_2$, and $BCl_3$;
    changing the etch chemistry to a second etch chemistry by selecting the etch chemistry from the group consisting of $SF_6$ $CF_4$, $CHF_3$, and $C_2F_6$, wherein the etch rates of the second metal layer and the exposed dielectric layer, as provided by the second etch chemistry are approximately equal; and
    over-etching the second metal layer with the second etch chemistry such that a portion of the aluminum plug not covered by the second metal layer is etched substantially flush with the surrounding dielectric.

15. A method of etching a semiconductor device having aluminum alloy lines over aluminum alloy plugs surrounded by a dielectric layer and electrically coupled to a lower level metal layer, comprising:
    placing one or more wafers inside a plasma etch reactor chamber;
    reducing the chamber pressure until vacuum is achieved;
    performing a bulk etch of the aluminum alloy lines and aluminum alloy plugs;
    performing an endpoint etch of the aluminum alloy lines and aluminum;
    performing a residue etch of the aluminum alloy lines and aluminum plugs;
    performing an over-etch of the aluminum alloy lines and aluminum alloy plugs wherein the etch rates of the aluminum alloy lines and the dielectric layer, as provided by the over etch are approximately equal; and
    breaking vacuum so that wafers can be removed from the plasma etch reactor chamber.

16. The method as recited in claim 15 wherein the aluminum alloy plugs are surrounded by a barrier layer.

17. The method as recited in claim 16 wherein performing an over-etch of the aluminum alloy lines and aluminum alloy plugs comprises etching portions of the aluminum alloy plugs and the barrier layer, not covered by the aluminum alloy lines, substantially flush with the surrounding dielectric layer.

18. The method as recited in claim 16 wherein the barrier layer is comprised of a metal selected from the group consisting of titanium, tantalum, tungsten, and molybdenum.

19. A method of etching a semiconductor device having aluminum alloy lines over aluminum alloy plugs surrounded by a dielectric layer and a barrier layer and electrically coupled to a lower level metal layer, comprising:

placing one or more wafers inside a plasma etch reactor chamber;

reducing the chamber pressure until vacuum is achieved;

performing a bulk etch of the aluminum alloy lines and aluminum alloy plugs;

performing an endpoint etch of the aluminum alloy lines and aluminum;

performing a residue etch of the aluminum alloy lines and aluminum plugs;

performing an over etch of the aluminum alloy lines and aluminum alloy plugs wherein the etch rates of the aluminum alloy lines, the dielectric layer and the barrier layer, as provided by the over etch are approximately equal; and breaking vacuum so that wafers can be removed from the plasma etch reactor chamber.

20. The method as recited in claim 19 wherein the barrier layer is comprised of a metal selected from the group consisting of titanium, tantalum, tungsten, and molybdenum.

21. The method as recited in claim 15 wherein performing the bulk etch of the aluminum alloy lines includes:

introducing $BCl_3$ and $Cl_2$ at a flow rate of about 30 to 40 sccm for each species and maintaining chamber pressure to a range of about 9 to 12 mT for about 30 seconds; and etching the aluminum alloy lines for about 20 to 28 seconds at an RF-Top Power between 300 and 415 watts and an RF-Bottom Power between 85 to 115 watts;

wherein the performing the endpoint etch includes:

etching for about 42 to 58 seconds at an RF Top Power between 300 and 415 watts and an RF Bottom Power between 190 to 260 watts until a trigger value of indicating AlCu clearing is reached;

wherein the performing the residue etch includes:

changing the $BCl_3$ and $Cl_2$ flow rates to a range 43 to 58 sccm and to a range of 25 to 35 sccm, respectively and etching for about 3 to 7 seconds; and wherein performing the over etch includes:

introducing $SF_6$ at a flow rate of 17 to 23 sccm and etching for about 43 to 58 seconds.

22. The method as recited in claim 19 wherein performing the bulk etch of the aluminum alloy lines includes:

introducing $BCl_3$ and $Cl_2$ at a flow rate of about 30 to 40 sccm for each species and maintaining chamber pressure to a range of about 9 to 12 mT for about 30 seconds; and performing a TiN and AlCu bulk etch for about 20 to 28 seconds at an RF-Top Power between 300 and 415 watts and an RF-Bottom Power between 85 to 115 watts;

wherein the performing the endpoint etch includes:

performing an AlCu endpoint etch for about 42 to 58 seconds at an RF Top Power between 300 and 415 watts and an RF Bottom Power between 190 to 260 watts until a trigger value of indicating AlCu clearing is reached;

wherein the performing the residue etch includes:

changing the $BCl_3$ and $Cl_2$ flow rates to a range 43 to 58 sccm and to a range of 25 to 35 sccm, respectively and performing a copper residue etch for about 3 to 7 seconds; and wherein performing the over-etch includes:

introducing a flourine-containing gas at a flow rate of 17 to 23 sccm and performing an over-etch for about 43 to 58 seconds.

23. A method of etching a semiconductor device after the formation of aluminum alloy lines over aluminum alloy plugs coupled to a lower level metal layer without forming plug recesses comprising:

placing one or more wafers inside a plasma etch reactor chamber;

reducing the chamber pressure until vacuum is achieved;

introducing $BCl_3$ and $Cl_2$ at a flow rate of about 30 to 40 sccm for each species and maintaining chamber pressure to a range about 9 to 12 mT for about 30 seconds;

performing a TiN and AlCu bulk etch for about 20 to 28 seconds at an RF-Top Power between 300 and 415 watts and an RF-Bottom Power between 85 to 115 watts;

performing an AlCu endpoint etch for about 42 to 58 seconds at an RF Top Power between 300 and 415 watts and an RF Bottom Power between 190 to 260 watts until a trigger value indicating AlCu clearing is reached;

changing the $BCl_3$ and $Cl_2$ flow rates to a range 43 to 58 sccm and to a range of 25 to 35 sccm, respectively and performing a copper residue etch for about 3 to 7 seconds;

introducing a flourine-containing gas at a flow rate of 17 to 23 sccm and performing an over-etch for about 43 to 58 seconds; and shutting off the flow of etchant gases and allowing chamber to pump down to vacuum; and breaking vacuum so that wafers can be removed from the plasma etch reactor chamber.

24. A process for forming a semiconductor structure on a wafer, comprising:

providing a first exposed surface of an Al plug in a via surrounded by a second exposed dielectric;

providing third exposed surface of a metal interconnect layer above the surface of the Al plug; and etching each of the first, second and third surfaces at substantially the same rate.

* * * * *

UNITED STATES PATENT AND TRADEMARK OFFICE
CERTIFICATE OF CORRECTION

PATENT NO. : 6,255,226 B1
DATED : July 3, 2001
INVENTOR(S) : Zheng et al.

Page 1 of 1

It is certified that error appears in the above-identified patent and that said Letters Patent is hereby corrected as shown below:

Column 10,
Line 32, after "$SF_6$", please insert -- , --.

Column 11,
Lines 39 and 44, after "wherein" please delete "the".

Column 12,
Lines 1 and 7, after "wherein" please delete "the".

Signed and Sealed this

Twenty-third Day of April, 2002

Attest:

JAMES E. ROGAN
Attesting Officer
Director of the United States Patent and Trademark Office